United States Patent [19]

Masada

[11] Patent Number: 4,621,967
[45] Date of Patent: Nov. 11, 1986

[54] AUTOMATIC BOARD LOADERS

[75] Inventor: Daizo Masada, Urayasu, Japan

[73] Assignee: USM Corporation, Hartford, Conn.

[21] Appl. No.: 670,663

[22] Filed: Nov. 13, 1984

Related U.S. Application Data

[63] Continuation of Ser. No. 340,474, Jan. 18, 1982, abandoned.

[51] Int. Cl.⁴ ............................................. B65G 1/12
[52] U.S. Cl. ................................... 414/225; 198/580; 414/331; 414/403; 414/608
[58] Field of Search ............... 414/331, 403, 222, 224, 414/225, 226, 608; 198/472, 580, 339; 29/700

[56] References Cited

U.S. PATENT DOCUMENTS

| | | | |
|---|---|---|---|
| 3,902,615 | 9/1975 | Levy et al. ............................ | 414/331 |
| 3,968,885 | 7/1976 | Hassan et al. ........................ | 414/591 |
| 4,062,463 | 2/1977 | Hillman et al. ...................... | 414/225 |
| 4,065,003 | 12/1977 | Hostettler ........................ | 414/222 X |
| 4,141,458 | 2/1979 | Brooks et al. ....................... | 414/331 |
| 4,274,529 | 6/1981 | Mori et al. ......................... | 198/339 |
| 4,336,438 | 6/1982 | Uehara et al. .................. | 198/339 X |
| 4,362,454 | 12/1982 | Kripzak ........................... | 414/331 X |

FOREIGN PATENT DOCUMENTS 445609  12/1975  U.S.S.R. .............................. 414/403

*Primary Examiner*—Robert J. Spar
*Assistant Examiner*—Donald W. Underwood
*Attorney, Agent, or Firm*—Alan N. McCartney

[57] ABSTRACT

A mechanism for automatically loading and unloading a printed circuit board from a machine for assembling electronic components to a board. This mechanism receives the board from a board storage magazine and places the board on an X-Y component placement station of the assembly machine. After the components have been placed onto the board, the board is dropped down through the table and transferred back to the storage magazine.

11 Claims, 9 Drawing Figures

AUTOMATIC BOARD LOADERS

This application is a continuation, of application Ser. No. 340,474, filed Jan. 18, 1982 abandoned.

BACKGROUND OF THE INVENTION

As a result of the development of machines for automatically inserting electronic components into printed circuit boards, it has become desirable to provide mechanisms to automatically supply the board to the component insertion machines. Devices of this type are illustrated in U.S. Pat. Nos. 3,722,062; 3,808,662; 4,209,898 and 4,283,847. These mechanisms all operate on the principle of transferring the board from one end of the component insertion device to the other by means of a continuous conveyor of some type upon which the board is carried. This requires the board to be removed from one storage magazine and transferred to a separate receiving magazine after the component insertion has taken place.

SUMMARY OF THE INVENTION

It is the object of this invention to provide an automatic printed circuit board loader for automatically placing the board on an electronic component insertion machine table and for automatically removing the board from the table after the component insertion operation has been completed.

It is a further object of this invention to provide an automatic board loader wherein the board is received from a storage magazine by a transfer mechanism and placed on an X-Y component insertion table and after the insertion operation, the board is lowered or dropped through the table and transferred back to the storage magazine. In addition, with the magazine being raised and lowered in timed sequence with the automatic loader and component insertion machine, the board can be removed from and replaced to the same tray of the storage magazine. In this manner, a single storage magazine can be utilized to supply the board to the component insertion machine and receive the assembled board. This minimizes the handling of each individual board not heretofore, accomplished by the prior art.

All of the above operations are software controlled so that the board loading, component insertion and board unloading occurs in proper timed sequence.

It is an additional object of this invention to provide an automatic board loader that permits a single board storage magazine to supply a board to a component insertion machine and receive the assembled board from the machine. In this fashion, a single double headed component assembly machine can be used in an assembly line, with different size boards being automatically fed from the right and left hand sides to the assembly machine.

BRIEF DESCRIPTION OF THE DRAWINGS

These and other objects will become apparent upon reading the following description with the accompanying drawings which illustrate.

DESCRIPTION OF THE PREFERRED EMBODIMENT

Figure 1:
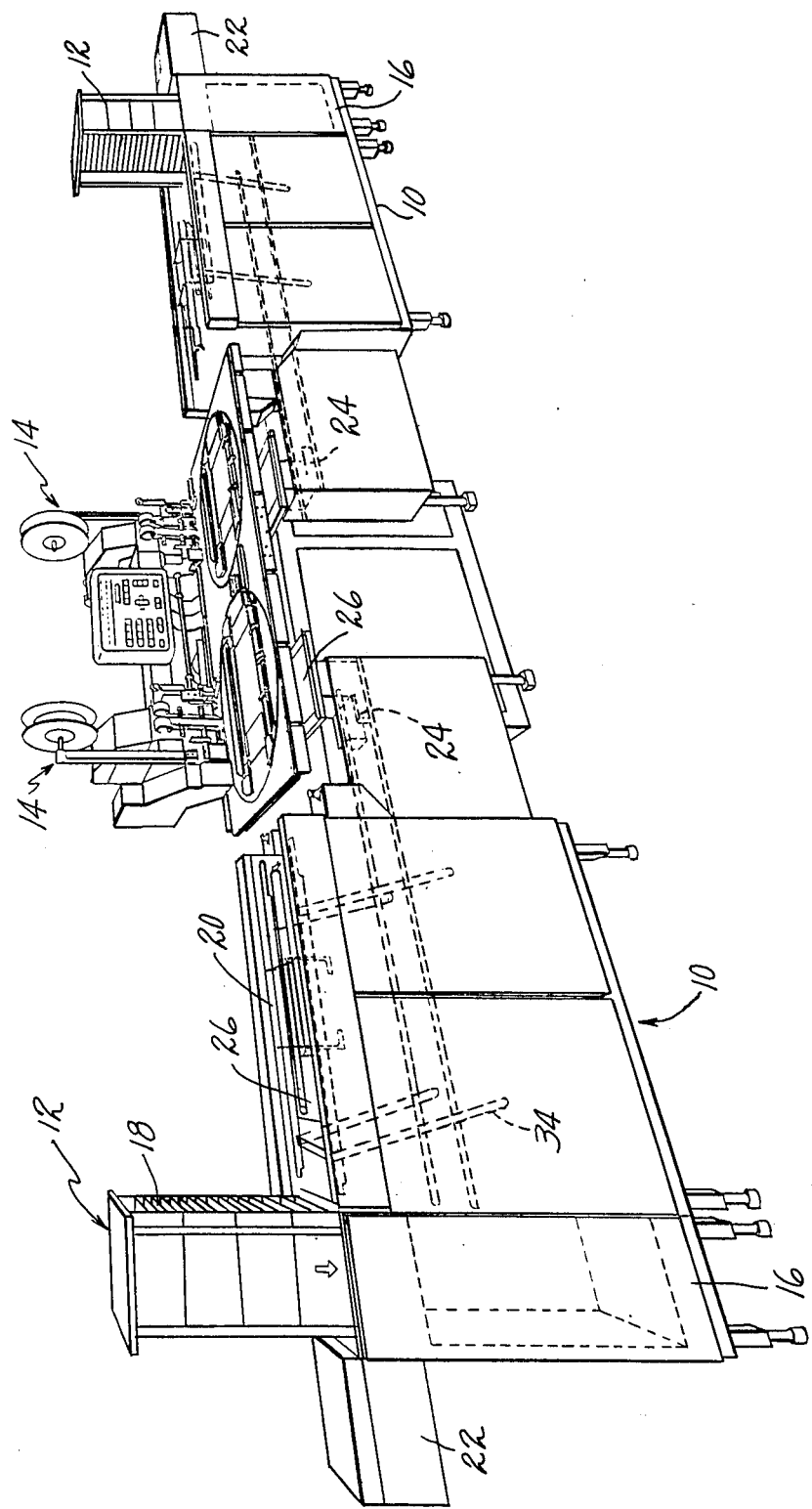
FIG. 1 illustrates a perspective view of dual automatic board loaders and unloaders for a double headed electronic component insertion machine.

Attention is now directed to FIG. 1 which illustrates the automatic board loader 10 which receives a printed circuit board from a and storage magazine 12 and transfers the board to any conventional component insertion machine 14 which places electronic components into the board. The insertion machine has an X-Y table and a double insertion head which receives the components from a reel and places them into the board. The insertion machine can be of the type illustrated in U.S. Pat. No. 4,063,347 and can have either a reel or tube type component supply source. After completion of the component insertion, the board is transferred back to the magazine and replaced to the magazine tray from which it was removed.

The magazine 12 is placed in a carrier 16 which contains a means for sequentially lowering the magazine so that individual trays 18 are positioned adjacent the board loader transfer mechanism 20. An air cylinder 22 pushes the selected board from the magazine tray onto the transfer mechanism which moves the board onto the X-Y table of the insertion machine. Upon completion of the insertion of the components into the board, the assembled board is dropped through the X-Y table and transported back to the magazine by the board unloader return mechanism 24. In the meantime, the magazine control mechanism in carrier 16 has lowered the magazine to a position so that the magazine tray from which the board was removed will receive that particular assembled board. After all boards contained in a given magazine have been assembled, the magazine is removed from the carrier and a new magazine is inserted into the carrier. This entire sequence of the board loading, component insertion and return of the assembled board to the magazine is software controlled so that each portion of the operation properly occurs in the desired predetermined sequence. This novel manner of handling printed circuit boards also permits double headed component assembly machine to be used as illustrated in FIG. 1, with the automatic board loaders supplying boards from opposite sides of the machine. In this fashion, different types of boards can be assembled with a single assembly machine. Further, with dual headed machines of the type illustrated in FIG. 1, positioned parallel to one another, with an intermediate operator station, a single operator can control four different boards at one time.

Figure 2:
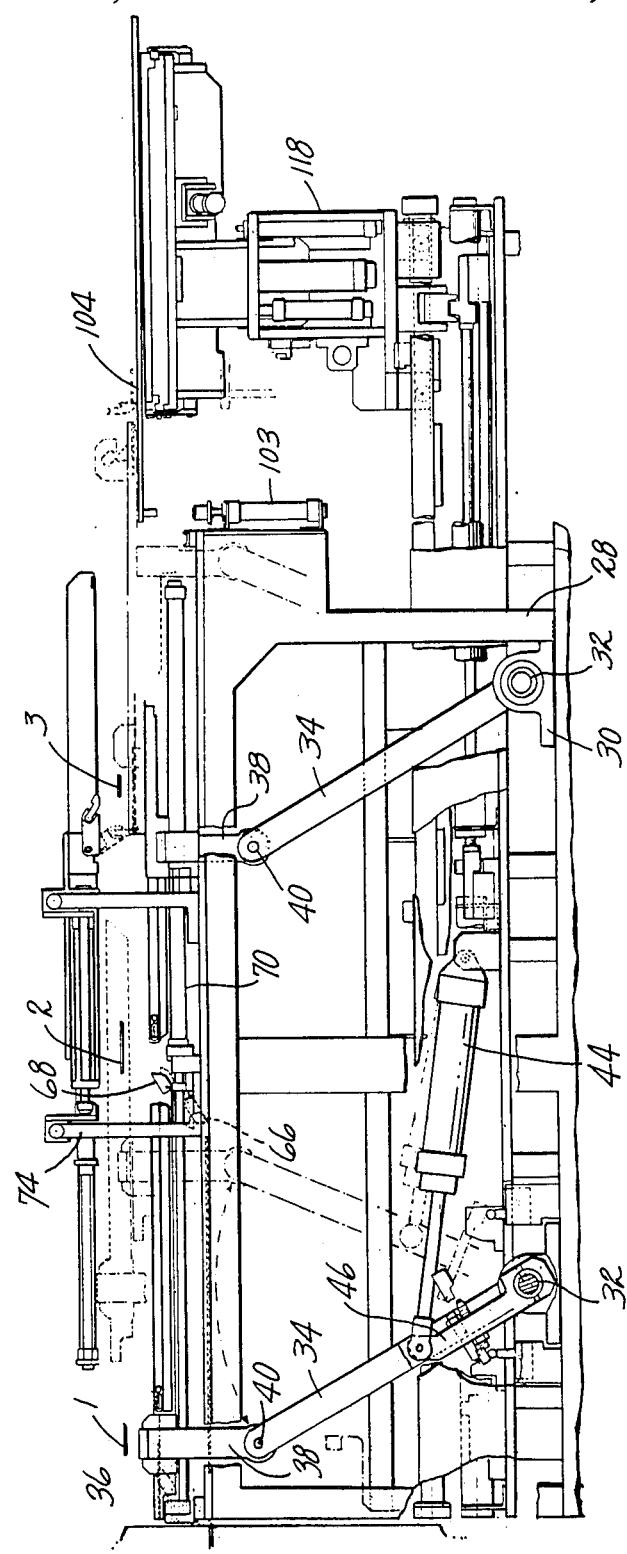
FIG. 2 is a side elevational view of the board loader—unloader of this invention.
Figure 3:
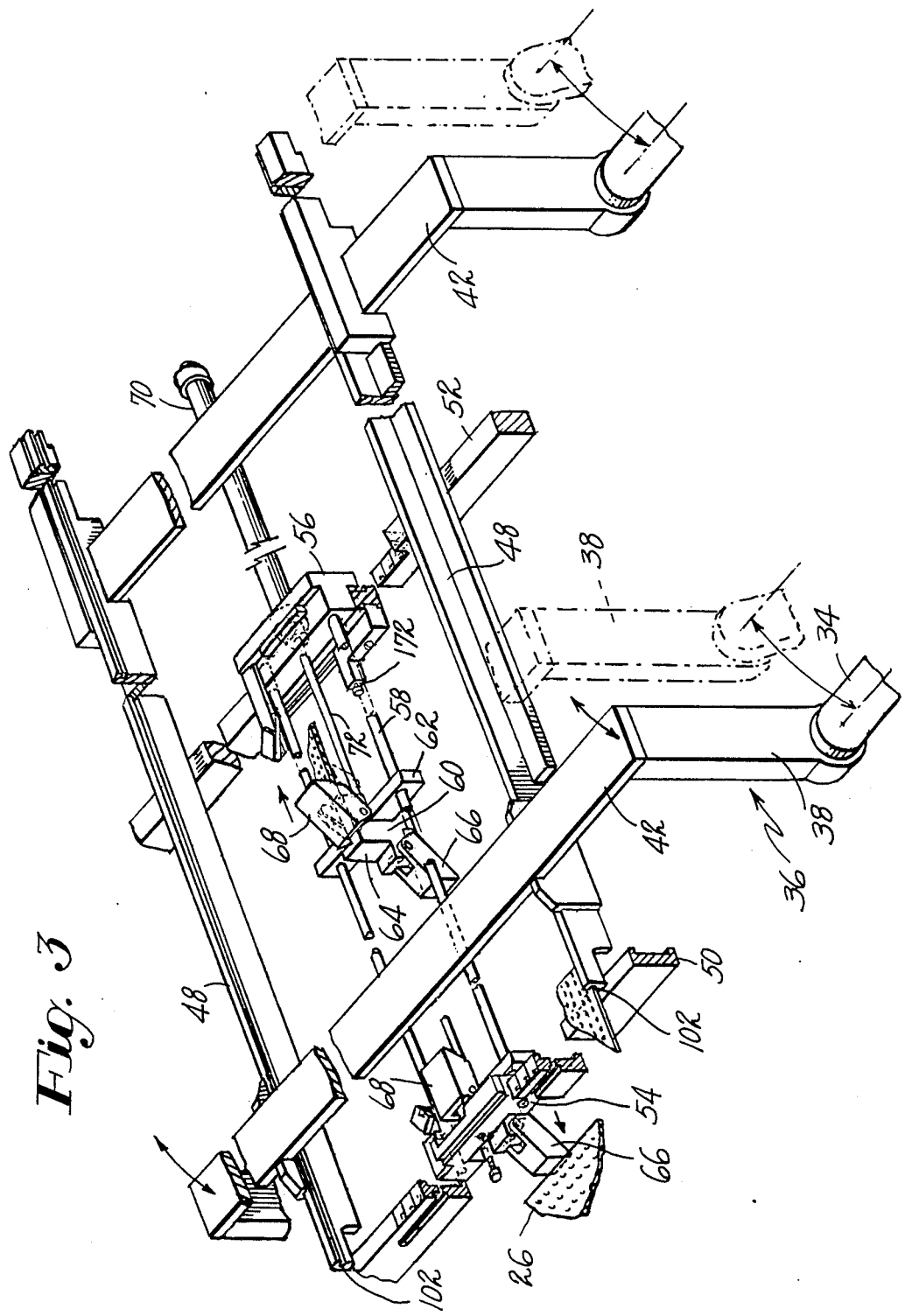
FIG. 3 is a perspective view partially broken away of the board loading carrier.
Figure 4:
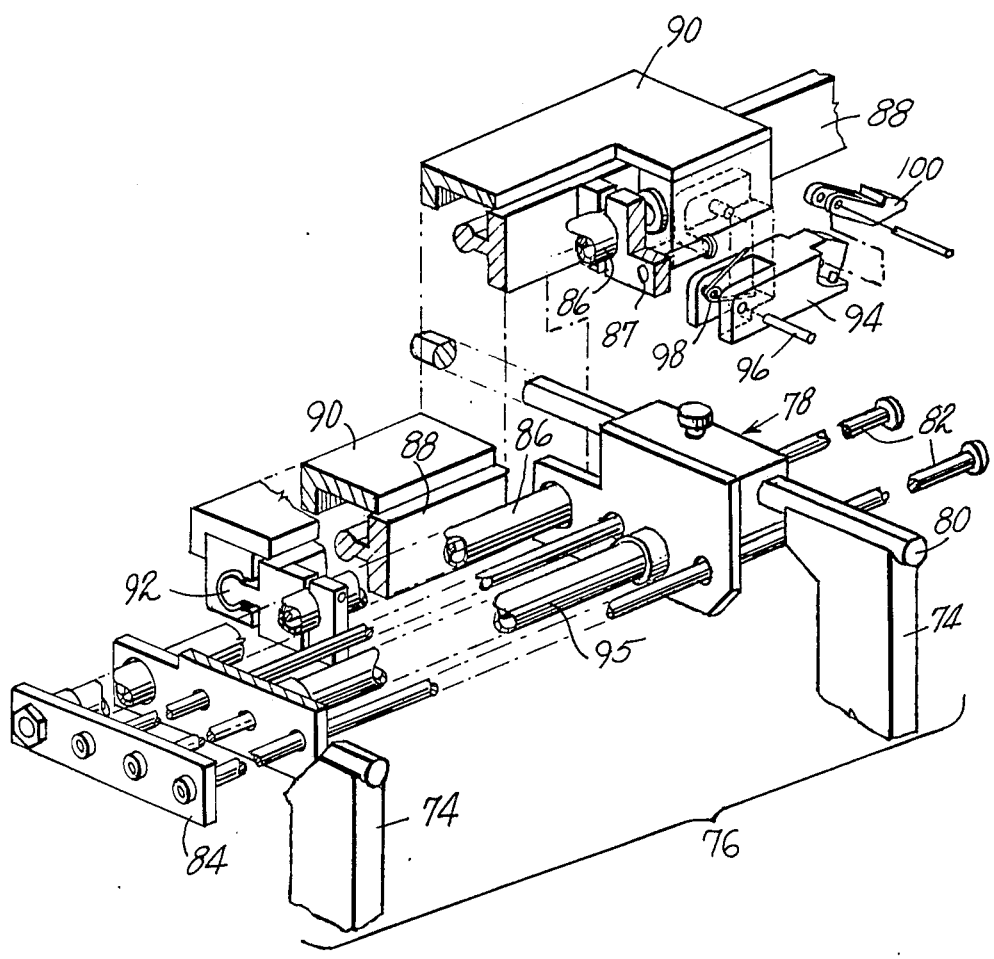
FIG. 4 is a perspective view of the pusher arm for inserting the board into the table of the component assembly machine.

Attention is now directed to FIGS. 2, 3 and 4 which disclose the loader - unloader having a frame 28 supporting bearings 30 which carry parallel shafts 32. Secured to the shafts 32 is a parallelogram linkage 34 which supports transfer table 36. The table 36 has main supports 42 of the table (see FIG. 3). The table 36 is moved by cylinder 44 which actuates arm 46 secured to the shaft 32 as will become apparent hereinafter (see FIG. 2). Secured to supports 42 are board supports 48 carrying members 50, 52 upon which blocks 54, 56 are mounted. The mounting blocks 54, 56 support rails 58 (see FIG. 3), upon which board transfer mechanism 60 is slidably supported. Transfer mechanism 60 has a slide 62 carrying mounting block 64 having opposed spring biased pawls 66, 68. A cylinder 70 has a piston rod 72 attached to slide 62 to move the slide back and forth.

Supported on main frame 28 is an upper frame 74 supporting an additional board transfer mechanism 76 (see FIG. 4). This mechanism comprises supporting blocks 78 carried on arms 80 extending outwardly from frame 74. The blocks 78 carry guide rods 82 which support a slide plate 84 upon which a cylinder 86 is mounted. The cylinder 86 passes through blocks 78 and carries a plate 87 which supports rail 88 upon which a block 90 is mounted for linear movement on bearing 92. Another cylinder 95 is connected to plate 84 and when retracted causes the cylinder 86 and accompany rail - block 88, 90 to move from left to right in FIG. 2. Thereafter, actuation of cylinder 86 will cause block 90 to traverse rail 88 to further extend the block 90 to the right in FIG. 2. A spring biased pawl 94 is pivotally supported on block 90 by pivot pin 96. A spring 98 acts between the block and panel to bias the pawl downwardly. Pivotally supported on the end of the pawl is a board pusher 100.

With the apparatus thus described, the board is loaded onto the X-Y assembly table as follows (see FIGS. 2 to 5): as the board is feed out of the magazine it is received in slots 102 in the board supports 48. At this point, the transfer mechanism 60 is extended with pawl 68 abutting the block 54 and being held in the retracted position as shown in FIG. 3. After the board is fully inserted into the slots 102, the trailing end of the board will be in position #1 as shown in FIG. 2. Upon retraction of cylinder 70, the pawl 68 is biased upwardly and contacts the trailing edge of the board and moves the board along slots 102 in the board support until the board reaches the position #2 as illustrated in FIG. 2. The cylinder 44 is then actuated to move linkage 34 and the board support 48 to the right to the dotted position as illustrated in FIG. 2. At this point, the trailing edge of the board is in position #3 in FIG. 2. At this time, the forward portion of the board support is over the top 104 of the X-Y table and the leading edge of the board is ready to be received in slots 105 of the X-Y table board support rails 106 (see FIGS. 5, 6 and 7). Then cylinders 103 are actuated to clamp the ends of rails to the table (see FIG. 2). Thereafter, actuation of cylinders 86 and 95 will release pawl 94 which contacts the trailing edge of the board and inserts the board into table rails 106.

Figure 5:
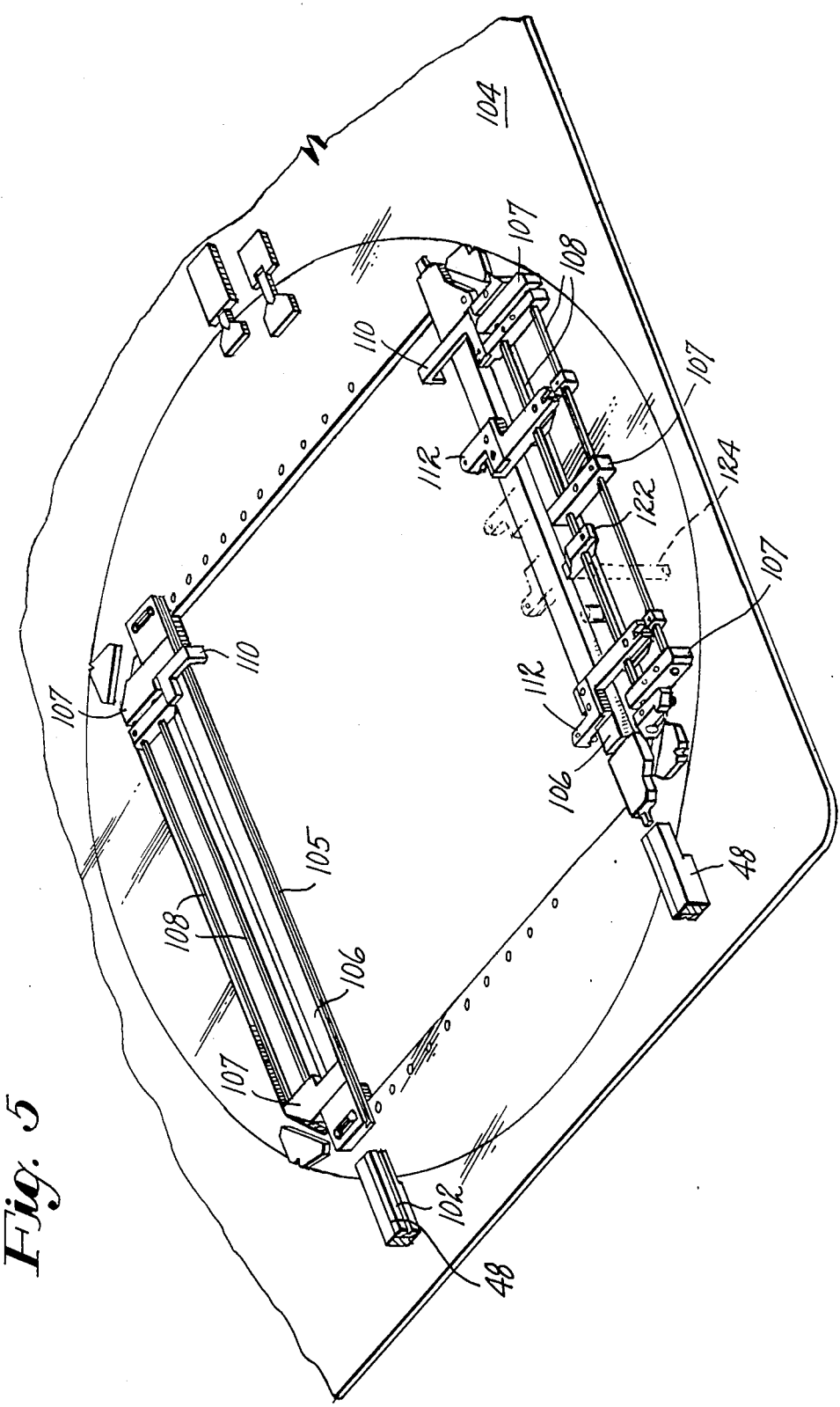
FIG. 5 is a perspective view of the insertion table board holder mechanism.

Attention is now directed to FIG. 5 which illustrates the board holding mechanism on the X-Y table at the component placement station. Rods 108 are carried on the table by bearing blocks 107 and have adjustable stops 110. The stops are adjustable on the rails for various sized boards. Also carried on the rods 108 are arms 112 having locating pins 114 adapted to be received in locating openings in the board.

Figure 6:
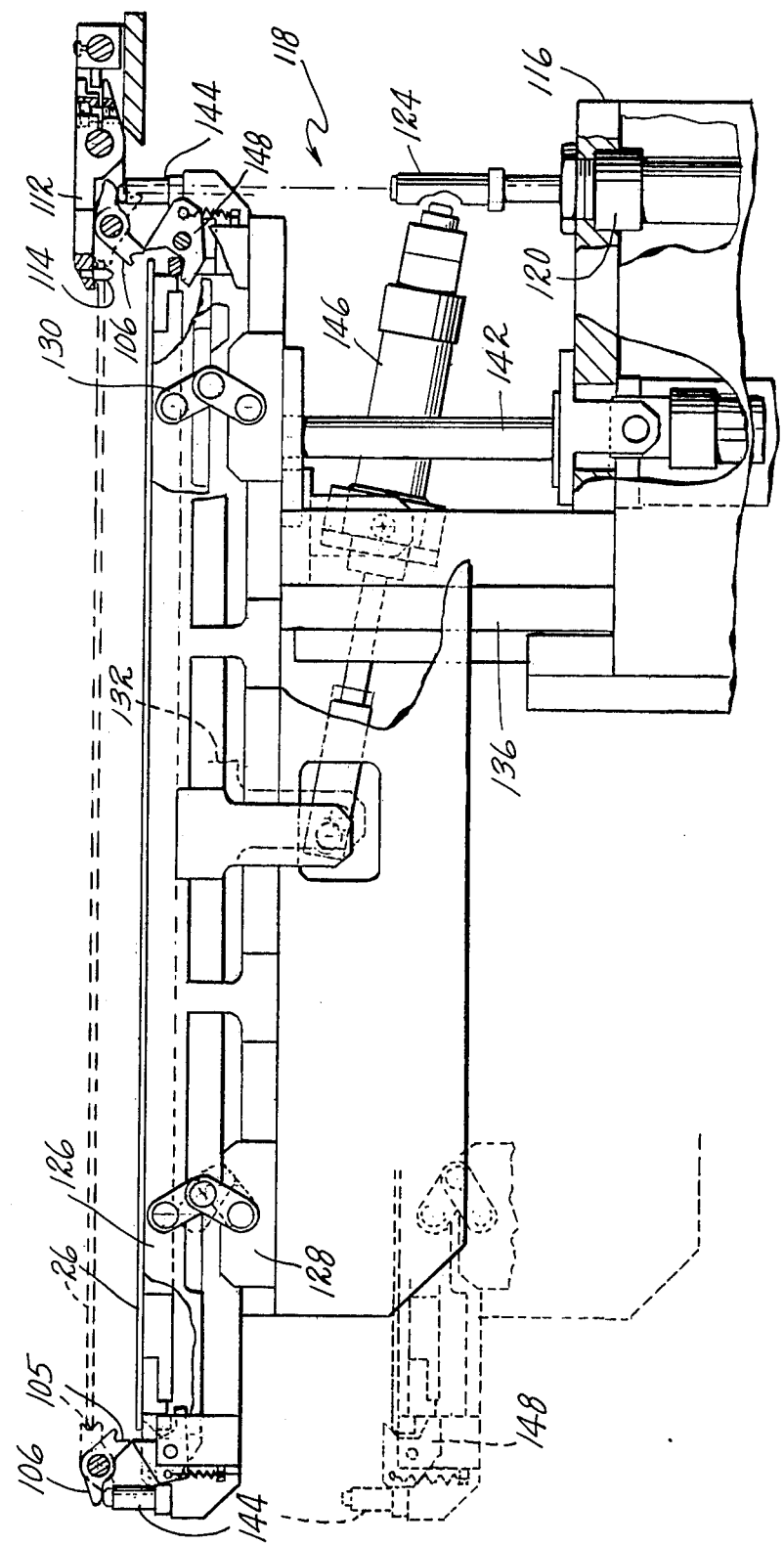
FIG. 6 is a side elevational view of the board holder and upper portion of the elevator mechanism.

Mounted in the support housing 116 of an elevator 118 is a cylinder 120 which contacts an abutment 122 attached on the rod 108 (see FIG. 6). As the pawl 94 moves the board into the rails 106, the piston rod 124 of cylinder 120 contacts the abutment 122, rotating rod 108 and lifting arms 112 up away from the table so that as the board passes down the rails 106, the pins 114 will be away from the board. After the board is fully inserted, the piston rod 124 is retracted, letting the locating pins 114 drop down into their openings in the board. The board is now in position clamped onto the table for component insertion at the placement station.

Attention is now directed to FIGS. 6 through 9 which illustrate the board unloading mechanism and the apparatus for returning the board back to the magazine. The elevator 118 has a platform 126 supported on a base 128 by a parallelogram linkage 130 carried on rods 132 which are shifted by a yoke 134. The base 128 is mounted on a vertical support 136 carried in a linear bearing 138 fastened to the housing 116. A main cylinder 140 has a rod 142 which controls the up and down movement of the elevator.

After completion of the component assembly at the placement station extension of rod 142 of cylinder 140 causes abutments 144 to contact and rotate rails 106 and dump the assembled board onto the elevator platform 126. At this time, cylinder 146 is activated moving rods 132 to the right in FIG. 6 and dropping the board through linkage 130 into locking engagement in rails 148 pivotally carried on the base 128 of the elevator. Thereafter, the piston rod 142 is retracted to lower the platform to the dotted position illustrated in FIG. 6.

Figure 7:
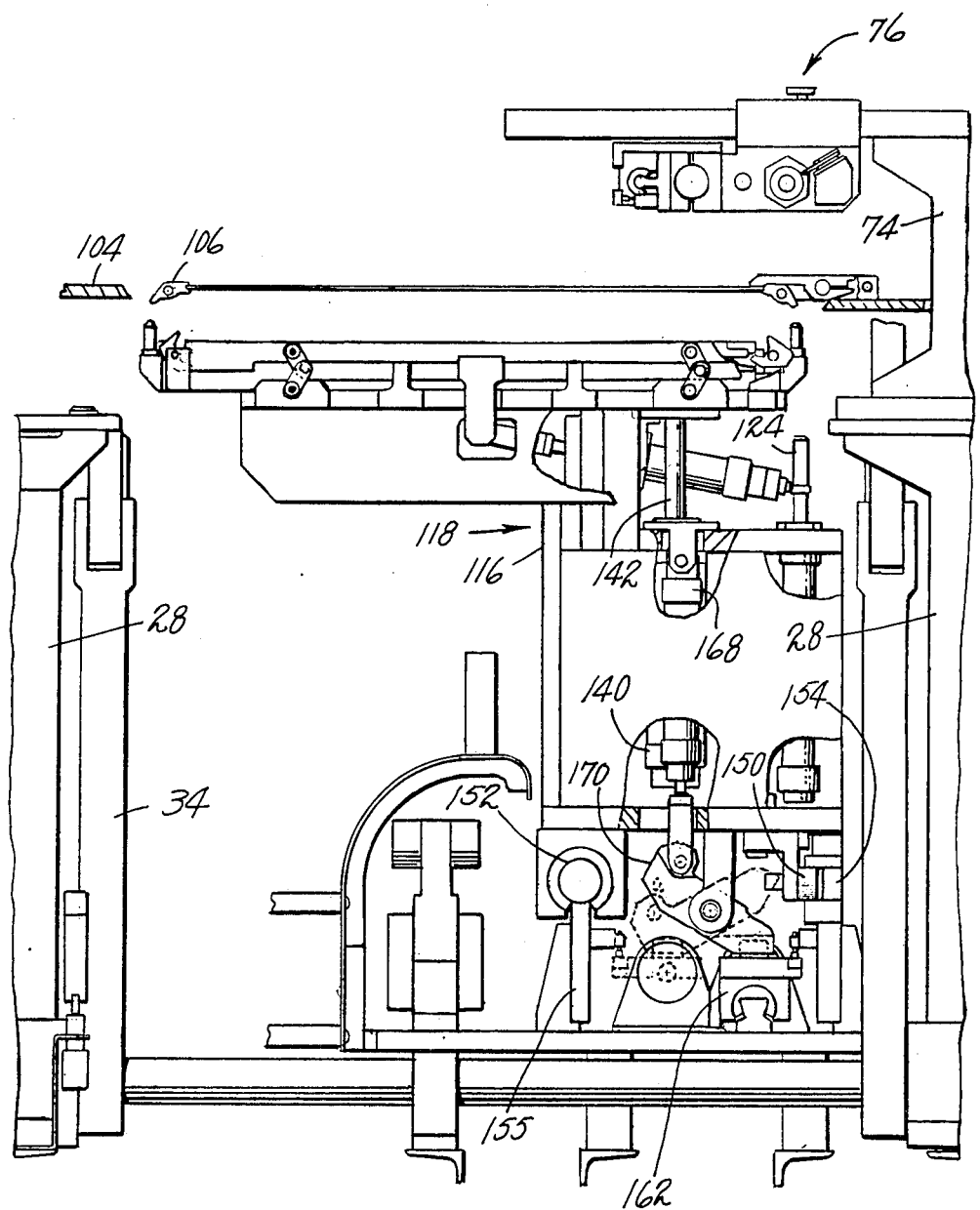
FIG. 7 is an end view of the elevator mechanism.
Figure 8:
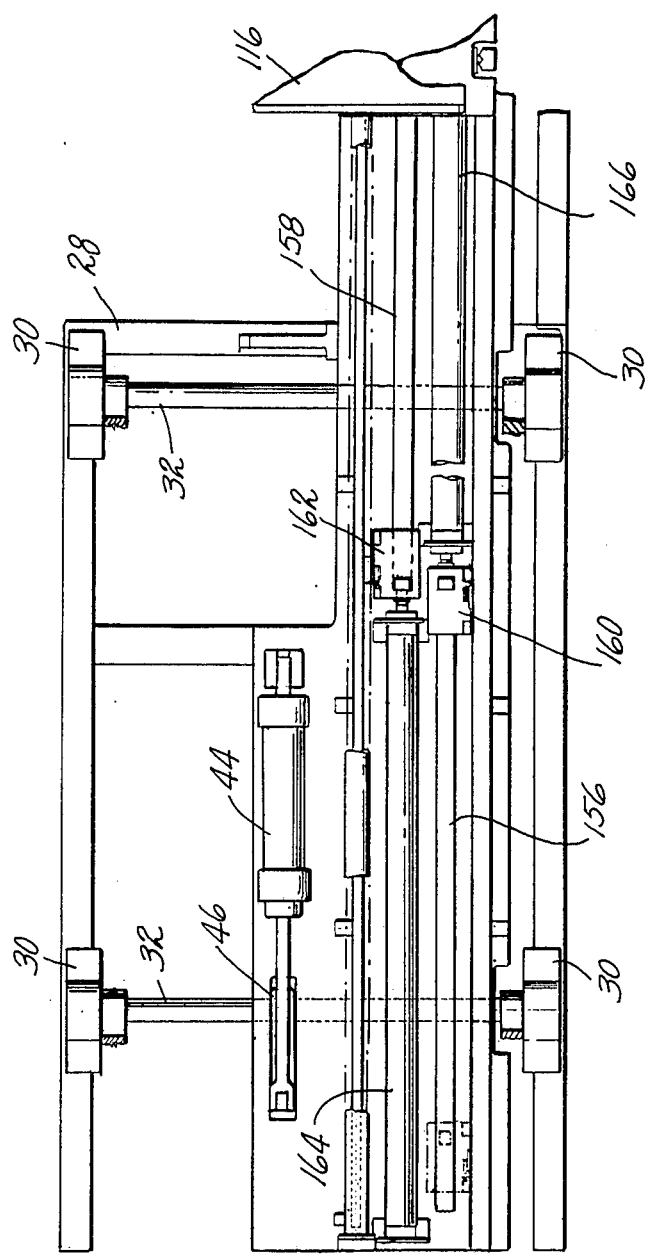
FIG. 8 is a top plan view of the unloader return mechanism which moves the elevator back to insert the board back into the storage magazine.
Figure 9:
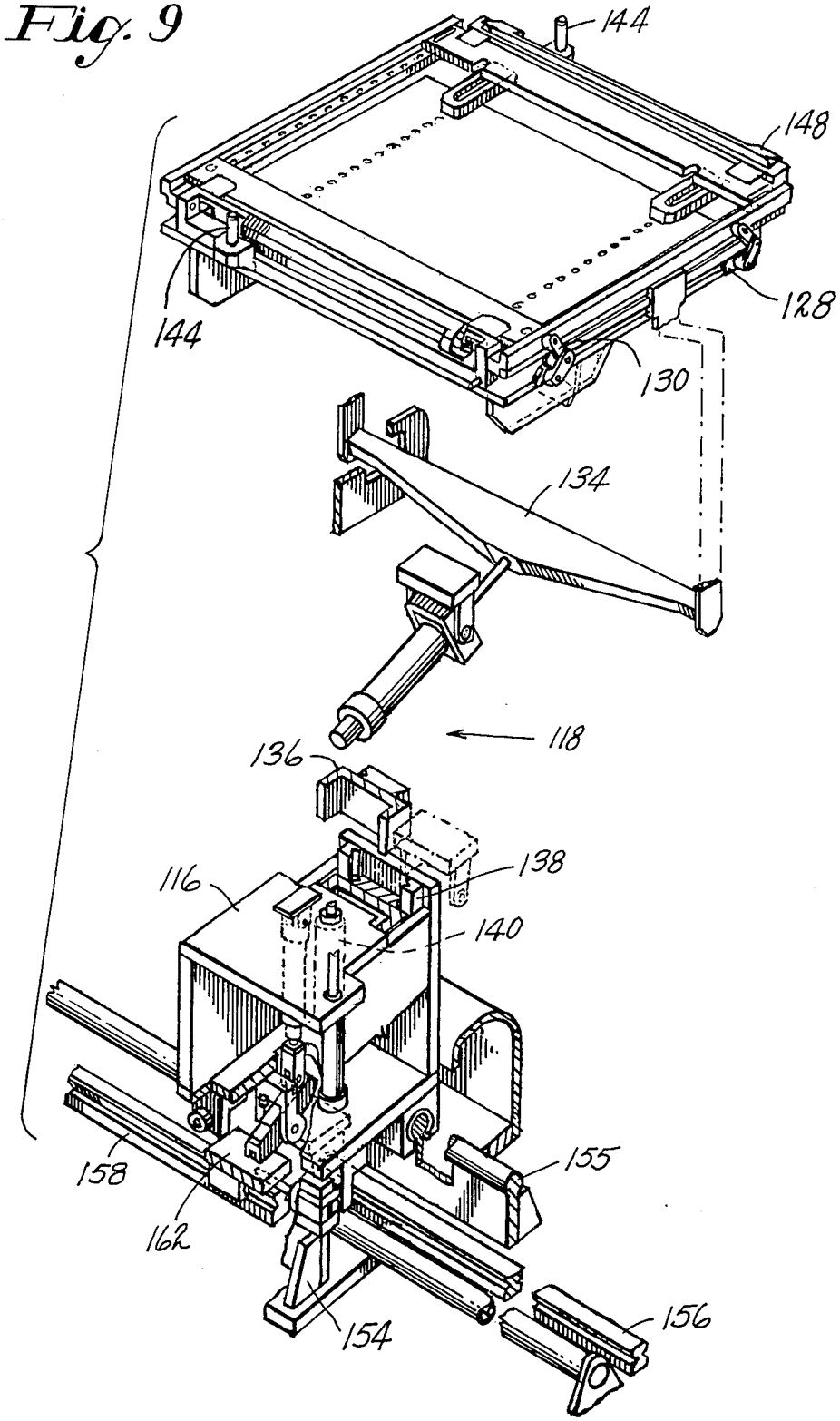
FIG. 9 is a perspective view of the elevator and unloader return mechanism.

Attention is now directed to FIGS. 7 to 9 which illustrate the board return mechanism. The elevator 118 is carried on a roller bearing 150 and linear bearing 152 which ride in tracks 154, 155 respectively on the machine supports. Once the elevator has been lowered, the elevator is in a position to be transported back toward the magazine. This is accomplished by means of a pair of rails 156, 158 upon which bearing blocks 160, 162 are carried and moved down the rails by cylinders 164, 166. The elevator 118 carries a cylinder 168 which positions a dog 170 pivotally carried in the housing 116. In the position of the elevator being under the X-Y table, the dog 170 contacts block 162. At this time, retraction of cylinder 164 moves the block and the entire elevator assembly down rail 158. Thereafter, upon extension of cylinder 168, dog 170 will be pivoted to the dotted position illustrated in FIG. 7 to be in engagement with block 160. Upon extension of cylinder 166, the block 160 and elevator assembly moves down rail 156 till elevator reaches the end of the track adjacent the magazine.

In the meantime, another board has been loaded onto the rails by the transfer mechanism 76 in the manner previously described and cylinder 70 (see FIG. 3), is retracted with the pawl 66 abutting stop 172 to keep the pawl in a raised position free from interference with the board on the elevator as the elevator travels to the end of the machine. Once the elevator reaches the end of the machine, the trailing edge of the board is adjacent the pawl 66. Upon re-extension of cylinder 70, the pawl 66 will drop down and engage the trailing edge of the board, sliding the board out of the rails 148 and into the original tray of the magazine from which it was removed.

Although this basic invention is disclosed in one preferred embodiment, it should be appreciated that there are other specific structures that fall within the basic concept of the automatic printed circuit board handling apparatus disclosed herein. For example, this novel apparatus could be used to automatically handle boards supplied to assembly machines for assembling components other than the loaded type.

I claim:

1. A machine for automatically loading and unloading printed circuit boards from an electrical component assembly machine having a component placing station comprising:
   (a) a board loading mechanism for receiving the board from a board storage means and transferring the board onto the component placing station of the assembly machine;
   (b) means for unloading an assembled board from the component placing station of the assembly machine;
   (c) said unloading means including means for returning the assembled board back toward the storage means;
   (d) said unloading means includes means for dropping the assembled board down through the placing station for returning the board back to the storage means.

2. The machine of claim 1 wherein said unloading means includes an elevator which receives the assembled board from the placing station, said elevator being carried on tracks for transporting the elevator toward the storage means.

3. The machine of claim 1 wherein said loading means includes a transfer table having board supports and means to move the board along the board supports and means to transport the transfer table toward the component assembly machine.

4. The machine of claim 3 including means to move the board from the transfer table into a board holding mechanism on the placing station.

5. The machine of claim 4 wherein said unloading means includes an elevator that receives the board from the board holding mechanism and lowers the board into a transport position to transfer the board back to the storage means.

6. The mechanism of claim 5 wherein the means to move the board along the board supports includes means to move the board off the elevator and into the storage means.

7. A machine for receiving printed circuit boards from a storage means and automatically loading and unloading them from a placing station of an electronic component assembly machine comprising:
   (a) a frame;
   (b) a parallelogram linkage carried on the frame and supporting a transfer table for receiving the boards from the storage means;
   (c) said transfer table having a board support including a means to transport the board along the support;
   (d) power means to actuate the parallelogram linkage and transport the transfer table toward the assembly machien;
   (e) means for moving the board off the transfer table on to the placing station;
   (f) elevator means for receiving the assembled board from the placing station and lowering the board to a position to be transported back to the storage means.

8. The machine of claim 7 including means for transporting the elevator back toward the storage means.

9. The machine of claim 8 wherein said means to transport the board along the board support includes means to remove the board from the elevator and redeposit the board into the storage means.

10. A machine for automatically loading and unloading printed circuit boards from an electrical component assembly machine having a component placing station comprising:
   a. a board loading mechanism for receiving the board from a board storage means located at one end of the machine only and transferring the board onto the component placing station of the assembly machine;
   b. means for unloading an assembled board from the component placing station of the assembly machine;
   c. said unloading means including means for returning the assembled board back toward the storage means at the same time said board loading mechanism transfers another board onto said component placing station;
   d. said unloading means including means for dropping the assembled board down from the placing station for returning the board back to the storage means.

11. A machine for automatically loading and unloading printed circuit boards from an electrical component placing station of an assembly machine comprising:
   a. a board loading mechanism for receiving the board from a board storage means located at one end of the machine only and transferring the board onto the component placing station of the assembly machine, said board loading mechanism vertically displacing the board while transferring the board;
   b. means for unloading an assembled board from the component placing station of the assembly machine;
   c. said unloading means including means for returning the assembled board back toward the storage means at the same time a board is positioned at the component placing station; and
   d. said unloading means including means for dropping the assembled board down from the placing station for returning the board back to the storage means.

* * * * *